United States Patent
Tang et al.

(10) Patent No.: US 10,859,659 B2
(45) Date of Patent: Dec. 8, 2020

(54) MOTION MONITORING METHOD DURING MR IMAGING, COMPUTER PROCESS, AND STORAGE DEVICE

(71) Applicant: GE Precision Healthcare LLC, Wauwatosa, WI (US)

(72) Inventors: Weinan Tang, Beijing (CN); Longqing Wang, Beijing (CN); Qingyu Dai, Beijing (CN); Dan Wu, Beijing (CN); Haoyang Xing, Beijing (CN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 29 days.

(21) Appl. No.: 16/174,366

(22) Filed: Oct. 30, 2018

(65) Prior Publication Data

US 2019/0128990 A1 May 2, 2019

(30) Foreign Application Priority Data

Oct. 31, 2017 (CN) .......................... 2017 1 1047981

(51) Int. Cl.
*G01R 33/565* (2006.01)
*G01R 33/56* (2006.01)
*G01R 33/567* (2006.01)

(52) U.S. Cl.
CPC ... *G01R 33/56509* (2013.01); *G01R 33/5608* (2013.01); *G01R 33/5673* (2013.01)

(58) Field of Classification Search
None
See application file for complete search history.

(56) References Cited

U.S. PATENT DOCUMENTS

| | | | |
|---|---|---|---|
| 6,788,063 B1* | 9/2004 | Peterson | G01R 33/28 324/318 |
| 10,488,482 B2* | 11/2019 | Rearick | G01R 33/3856 |
| 2005/0200357 A1* | 9/2005 | Pruessmann | G01R 33/5611 324/309 |
| 2008/0315879 A1* | 12/2008 | Saha | A61B 5/055 324/318 |
| 2010/0013472 A1* | 1/2010 | Buehrer | G01R 33/3415 324/307 |
| 2011/0175609 A1 | 7/2011 | Hu et al. | |
| 2016/0169993 A1* | 6/2016 | Rearick | G01R 33/3806 324/309 |

(Continued)

OTHER PUBLICATIONS

Andreychenko et al., "Thermal Noise Variance of a Receive Radiofrequency Coil as a Respiratory Motion Sensor," Magnetic Resonance in Medicine, Motion Sensor Based on Thermal Noise of RF Coil, 2017, p. 221-228.

(Continued)

Primary Examiner — Jermele M Hollington
(74) Attorney, Agent, or Firm — Armstrong Teasdale LLP

(57) ABSTRACT

Embodiments of the present invention provide a motion monitoring method during MR imaging, comprising: acquiring a noise of a receiving coil before or after each imaging repetition time of an imaging scanning sequence; determining main coil channels associated with a motion of a scanned object in the receiving coil; determining a sum of squares of amplitudes of noises of the respective main coil channels; and filtering the sum of squares of amplitudes of noises of the main coil channels to obtain a motion track of the scanned object.

20 Claims, 12 Drawing Sheets

(56) References Cited

U.S. PATENT DOCUMENTS

2017/0102443 A1* 4/2017 Rearick ................ G01R 33/383
2020/0025851 A1* 1/2020 Rearick .............. G01R 33/3854

OTHER PUBLICATIONS

Brau et al., "Generalized Self-Navigated Motion Detection Technique: Preliminary Investigation in Abdominal Imaging," Magnetic Resonance in Medicine, Self-Navigated Motion Detection, 2006, p. 263-270.

Graesslin et al., "Advancements in Contact-free Respiration Monitoring using RF Pick-up coils," Proc. Intl. Soc. Mag. Reson. Med., 2010, p. 3045.

* cited by examiner

MOTION MONITORING METHOD DURING MR IMAGING, COMPUTER PROCESS, AND STORAGE DEVICE

FIELD

The present invention relates to the field of medical detection, particularly to a motion monitoring method during MR imaging.

BACKGROUND

When a human body is imaged by utilizing a magnetic resonance (MR) scanning technology, an image artifact will usually appear, which is generated due to a patient's respiratory motion. In order to remove or reduce the respiratory motion artifact, there is usually a need to monitor the respiratory motion in real time.

In the prior art, one method is to monitor the respiratory motion by an external monitoring device, and to determine when to acquire image data according to the real-time monitoring result. Such method has the following disadvantages: 1) increasing time for the device configuration, 2) requiring more time for positioning the patient, 3) adding an extra device cost. There is also a navigation echo technology, which needs to apply extra radio frequency (RF) pulses and gradient pulses for respiratory gating or respiratory compensation before an image acquisition sequence. Such method would prolong the scanning time, reduce the scanning efficiency, and easily cause adverse effect on the process of image acquisition.

In addition, people skilled in the art have also put forward monitoring the respiratory motion by measuring an impedance of an RF coil. However, such method needs to provide an extra pick-up coil for the MR imaging system to couple with the RF coil for image acquisition, which needs to provide specialized RF monitoring pulses to substitute RF excitation pulses in an imaging sequence and also needs to perform drift compensation for the RF amplifier. There is a similar method that replaces the pick-up coil with an extra directional coupler. When these methods are implemented, effects on costs and feasibility need to be sufficiently taken into account.

SUMMARY

An objective of the present invention is to provide a respiratory motion monitoring method with higher accuracy and lower cost.

Embodiments of the present invention provide a motion monitoring method during MR imaging, comprising: acquiring noise of a receiving coil before or after each imaging repetition time of an imaging scanning sequence; determining main coil channels associated with a motion of a scanned object in the receiving coil; determining a sum of squares of amplitudes of noises of the respective main coil channels; and filtering the sum of squares of amplitudes of noises of the main coil channels to obtain a motion track of the scanned object.

The exemplary embodiments of the present invention also provide an MR imaging system that carries out the above motion monitoring method.

The exemplary embodiments of the present invention also provide a non-transitory computer readable media storing instructions, when running on an MR imaging system, causing the MR imaging system to carry out the above motion monitoring method.

Other features and aspects will become apparent from the following detailed description, the drawings, and the claims.

BRIEF DESCRIPTION OF THE DRAWINGS

The invention may be better understood by the description of the exemplary embodiments of the present invention in conjunction with the accompanying drawings, in which.

DETAILED DESCRIPTION

In the following, specific embodiments of the present invention will be described. It should be noted that, in the detailed description of these embodiments, all features of the actual embodiments may not be described in detail for conciseness and simplicity of the description. It should be understood, in actual implementation of any one of the embodiments, just as in any one engineering project or designing project, in order to achieve the developers' specific goals and in order to meet system-related or business-related restrictions, a variety of concrete decisions are often made, and this varies from one implementation to another. In addition, it should also be understood, although the effort made in such developing process may be complex and time-consuming, some variations such as design, manufacture and production on the basis of the technical contents disclosed in the disclosure are just customary technical means in the art for one of ordinary skilled in the art associated with the contents disclosed in the present disclosure, which should not be regarded as insufficient disclosure of the present disclosure.

Unless otherwise defined, all technical or scientific terms used in the claims and the description should be interpreted in the ordinary sense to one of ordinary skills in the art to which this invention belongs. The terms "first", "second" and the like in the Description and the Claims of the present utility model do not mean any sequential order, number or importance, but are only used for distinguishing different components. The terms "a", "an" and the like do not denote a limitation of quantity, but denote the existence of at least one. The terms "comprises", "comprising", "includes", "including" and the like mean that the element or object in front of the "comprises", "comprising", "includes" and "including" covers the elements or objects and their equivalents illustrated following the "comprises", "comprising", "includes" and "including", but do not exclude other elements or objects. The term "coupled" or "connected" or the like is not limited to being connected physically or mechanically, nor limited to being connected directly or indirectly.

Figure 1:
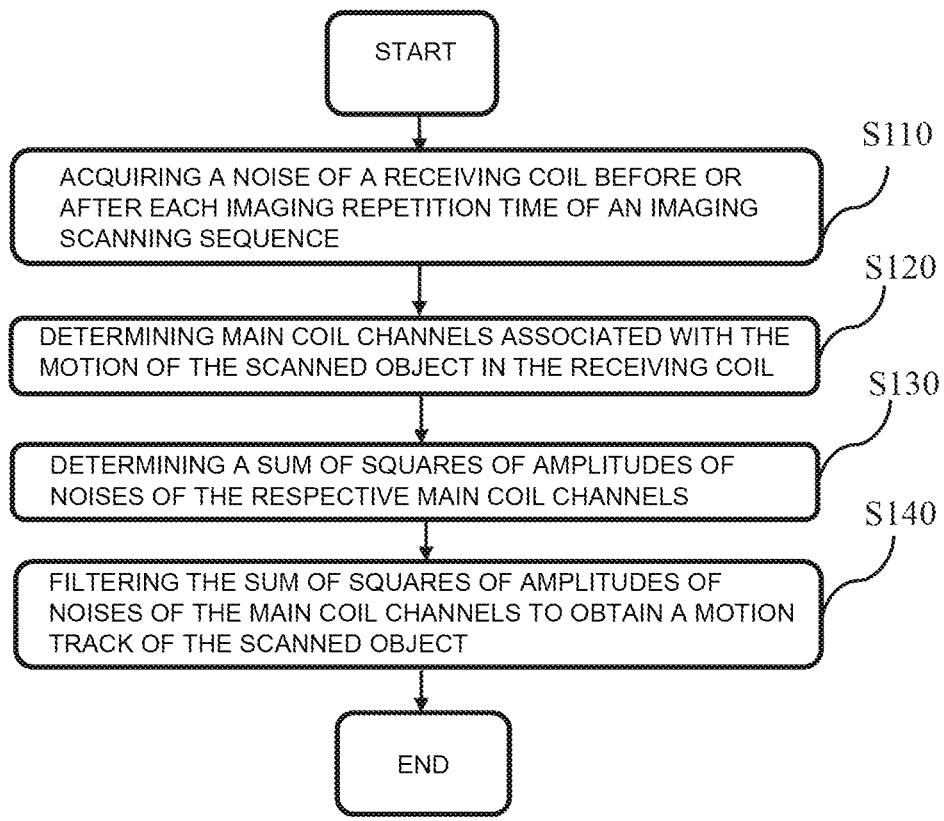
FIG. 1 is a flow chart of a motion monitoring method according to an exemplary embodiment.
Figure 2:
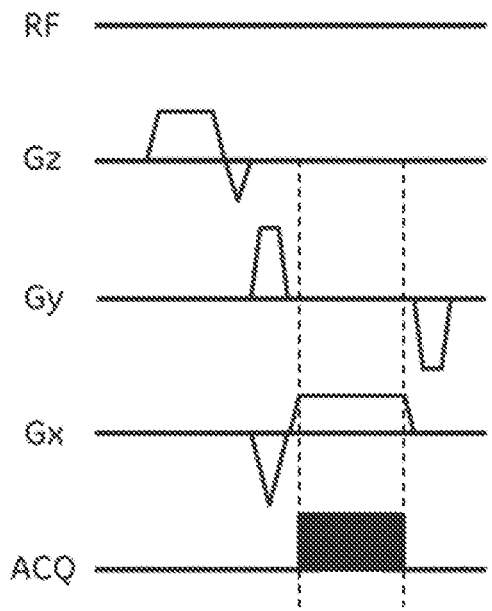
FIG. 2 illustrates navigation sequences performed when a noise of a receiving coil is acquired in accordance with an exemplary embodiment.
Figure 3:
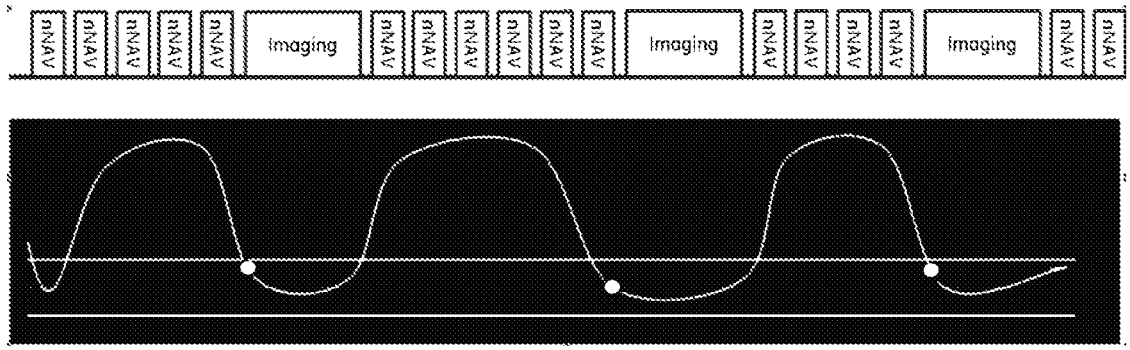
FIG. 3 is an example graph of applying a navigation sequence before each imaging repetition time.

FIG. 1 is a flow chart of a motion monitoring method in accordance with an exemplary embodiment, and FIG. 2 and FIG. 3 each illustrate schematic graphs of respiratory gating using said motion monitoring method. As shown in FIG. 1 to FIG. 3, the method comprises steps S110, S120, S130 and S140.

In the step S110, a noise of a receiving coil is acquired before or after each imaging repetition time of an imaging scanning sequence. People skilled in the art should understand that the above said imaging scanning sequence generally comprises excitation pulses for exciting an RF coil, gradient pulses for controlling a gradient field and the like, with an imaging repetition time (TR) thereof being a time from the beginning to the end of one imaging pulse sequence.

Researches show that a noise variation of a receiving coil is related to an effective resistance thereof, specifically as shown in Equation (1) below:

$$<V_{noise}^2> 4kTR_{eff}BW \quad (1)$$

wherein $V_{noise}$ represents the noise variation of the receiving coil, k is Boltzman constant, T represents Kelvin temperature, BW represents a bandwidth of the detection system, $R_{eff}$ represents the effective resistance of the receiving coil.

And the effective resistance of the receiving coil is related to a resistance of a human body near the receiving coil, specifically as shown in Equation (2) below:

$$R_{eff} = R_{body} + R_{coil} R_{electronics} \quad (2)$$

wherein $R_{body}$ represents the resistance of the human body, $R_{coil}$ represents the resistance of the receiving coil, $R_{electronics}$ represents a resistance of other electronic devices. In practice, values of $R_{coil}$ and $R_{electronics}$ are much less than that of $R_{body}$, so the effective resistance of the receiving coil is mainly from the resistance of the human body.

The resistance of the human body can be represented by Equation (3) below:

$$R_{body} = \frac{1}{I^2} \int_V \sigma(\vec{r}, t) \cdot \vec{E}(\vec{r}, t) \cdot \vec{E}^*(\vec{r}, t) dV \quad (3)$$

wherein σ represents a conductivity of a human body tissue, E represents an electric field in the human body induced by a current of a unit amplitude in the receiving coil, * represents a conjugate transposition, I represents the current in the receiving coil, V represents a voltage on the receiving coil, r represents the space position, t represents the time.

Researches show that a human body's motion can change the conductivity, electric field and the like of the human body itself, which also causes change in the human body's resistance. From the above Equation (2), it can be seen that a large portion of the resistance of the receiving coil is contributed by the human body. When the human body is placed in a scanning cavity of an MR imaging system, it can vary the impedance of the receiving coil near the human body.

Therefore, by acquiring the noise of the receiving coil in the step S110 and analyzing the acquired noise appropriately in the subsequent steps, a motion track of the scanned subject that is related to the noise can be obtained. The motion track may be, for example, a respiratory motion of the human body.

In the step S120, main coil channels associated with the motion of the scanned subject in the receiving coil are determined. People skilled in the art should understand that a receiving coil generally has a plurality of coil channels, which may be distributed in different locations in forms of arrays to be put close to different parts of the human body. Generally speaking, the closer to the moving part of the human body the coil channel is, the more obvious the impedance variation of the coil channel is. Therefore, by determining the coil channels associated with the motion of the scanned object as the main coil channels, the present step may improve accuracy and simplify subsequent analysis.

In the step S130, squares of amplitudes of noises of the respective main coil channels are summed up.

In the step S140, the sum of squares of amplitudes of noises of the main coil channels is filtered to obtain a motion track of the scanned object.

FIG. 2 exemplarily illustrates navigation sequences performed when the noise of the receiving coil is acquired in accordance with an exemplary embodiment. As shown in FIG. 2, in the step S110, "acquiring the noise of the receiving coil" is performed during a period in which application of RF excitation pulses is stopped. For example, a navigation sequence may be performed before or after each imaging repeating time of the imaging scanning sequence, wherein during the performing of the navigation sequence, application of RF excitation pulses is stopped and the noise of the receiving coil is acquired.

The navigation sequence illustrated as an example in FIG. 2 is a two-dimensional Cartesian gradient echo pulse sequence. In other embodiments, other forms of pulse sequences may also be adopted, as long as no RF excitation pulse is applied in the pulse sequences, e.g., application of gradient pulses Gx, Gy, Gz may also be stopped. By arranging such navigation sequence, when switching between the navigation sequence and the imaging scanning sequence, there is only a need to switch between triggering and shutting down of the RF excitation pulses, without the need to make other changes to the pulse sequence. The noise acquisition time may be minimized by utilizing a larger sampling bandwidth (e.g., ±500 kHz), so sufficient noise real-time acquisition points can be achieved. For example, a navigation repetition time has 500 noise acquisition points inside, and the noises acquired at these acquisition points may further be used to analyze the respiratory motion track.

FIG. 3 is an example graph of applying a navigation sequence before each imaging repetition time, in which the curve is a noise variation curve of the receiving coil, the two horizontal lines min and max respectively represent a minimum threshold value and a maximum threshold value of a noise amplitude, the first preset range may be greater than or equal to the minimum threshold value and less than or equal to the maximum threshold value. As shown in FIG. 3, the navigation sequence applied before each imaging repetition time may be arranged to: 1) be spaced from an adjacent imaging repetition time; 2) include a plurality of navigation repetition time, with adjacent navigation repetition time spaced from each other.

In the example as shown in FIG. 3, when the noise acquired during the performing of the navigation sequence is within the first preset range, one imaging repetition time of the imaging scanning sequence is triggered to acquire image data. The first preset range may correspond to positions at which image data of regions-of-interest can be well acquired. For example, during the respiration of the human body, the diaphragm thereof is close to a center position of the scanning slice and the direction in which the image data is read out is perpendicular to the diaphragm. Respiratory gating may be performed in this way, so that the imaging scanning sequence may be triggered at an appropriate timing so as to reduce image artifacts due to the human body's respiratory motion. Moreover, the embodiments of the present disclosure may continuously monitor the noise variation of the receiving coil during image acquisition. Compared with conventional triggering manner, the disclosure herein does not need extra time after the imaging repetition time to wait for recovery of longitudinal relaxation due to RF excitation pulses.

Figure 4:
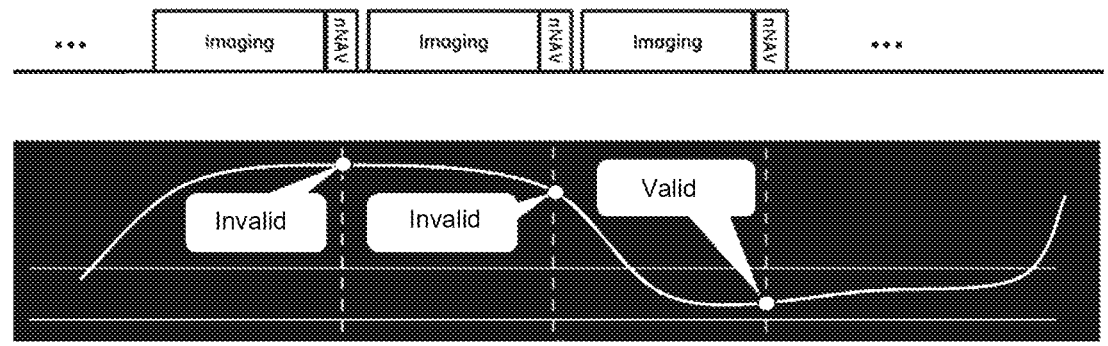
FIG. 4 is an example graph of applying a navigation sequence after each imaging repetition time.

FIG. 4 is an example graph of applying a navigation sequence after each imaging repetition time, in which the curve is a noise variation curve of the receiving coil, the two horizontal lines min and max respectively represent a minimum threshold value and a maximum threshold value of a noise amplitude, the second preset range may be greater than or equal to the minimum threshold value and less than or equal to the maximum threshold value. As shown in FIG. 4, the navigation sequence applied after each imaging repetition time may comprise a navigation repetition time that follows its preceding imaging repetition time, i.e., with no time interval between the navigation repetition time and its preceding imaging repetition time.

In the example as shown in FIG. 4, when an amplitude of the noise of the receiving coil acquired within any navigation repetition time is outside the second preset range, the image data acquired within the imaging repetition time in front of the navigation repetition time is determined as invalid image data; when the amplitude of the noise of the receiving coil acquired within any navigation repetition time is within the second preset range, the image data acquired within the imaging repetition time in front of the navigation repetition time is determined as valid image data.

The second preset range may be the same as the first preset range. Respiratory gating may be performed in this way, so that it can be determined, by noise navigation, whether the image data acquired in the corresponding imaging scanning sequence is accepted or not. In subsequent imaging processing, the invalid image data can be discarded, therefore image reconstruction is performed only based on the valid image data, thereby reducing image artifacts due to the respiratory motion.

Figure 5:
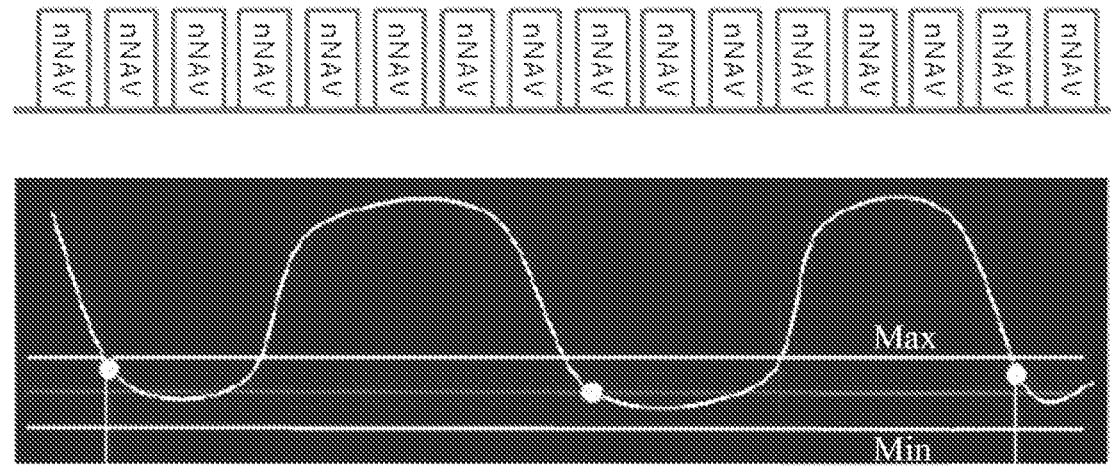
FIG. 5 is a schematic graph of a respiratory rate calculation pulse sequence in accordance with an exemplary embodiment.

FIG. 5 is a schematic graph of a respiratory rate calculation pulse sequence provided in one example of the present invention. As shown in FIG. 5, before the step S110, an appropriate first preset range and an appropriate second preset range may be obtained by performing the respiratory rate calculation pulse sequence in advance. The respiratory rate calculation pulse sequence comprises a plurality of navigation repetition times arranged sequentially. By recording variation information of the position of the region-of-interest (e.g., diaphragm) as the noise of the receiving coil changes in real time in each navigation repetition time, and by analyzing the recorded variation information of the position, noise values at the time when the region-of-interest is located at a position suitable for imaging scanning may be found out, and a first preset range and a second present range may be determined according to the noise values. For example, the first preset range may be a range between the maximum and minimum of the noise values, and the range may also be further adjusted appropriately as needed. The above position at which the region-of-interest is located, which is suitable for imaging scanning, may be, for example, the position where the diaphragm is close to the center of the slice and the direction in which the image is read out is perpendicular to the diaphragm.

It should be noted that in the schematic graphs of FIG. 3 to FIG. 5, any blocks marked with "imaging" is used to indicate one imaging repetition time of the imaging scanning sequence, and any block marked with "nNAV" is used to indicate one navigation repetition time of the navigation sequence.

In the step S110, the noise of each coil channel of the receiving coil may be acquired by anyone of the above embodiments, and in the step S120, the main coil channels associated with the respiratory motion among the coil channels may be determined according to the acquired noises.

Optionally, in the step S110, "acquiring noise of a receiving coil" may also comprise a step of preprocessing the acquired raw noise data, and then in the step S120, the above main coils may be determined based on the preprocessed noise. The process of preprocessing the acquired raw noise data may comprise:

Step One: filtering the raw noise data using a Kalman filter; and/or Step Two: de-coupling the raw noise data, e.g., removing the noise coupling on a non-diagonal line of the receiving coil array.

The step S120 may comprise the following steps:

Step One: analyzing frequency domain information of the noise acquired from each coil channel;

Step Two: designating coil channel(s) corresponding to frequency domain data with large frequency fluctuation as the main coil channel.

Figure 6:
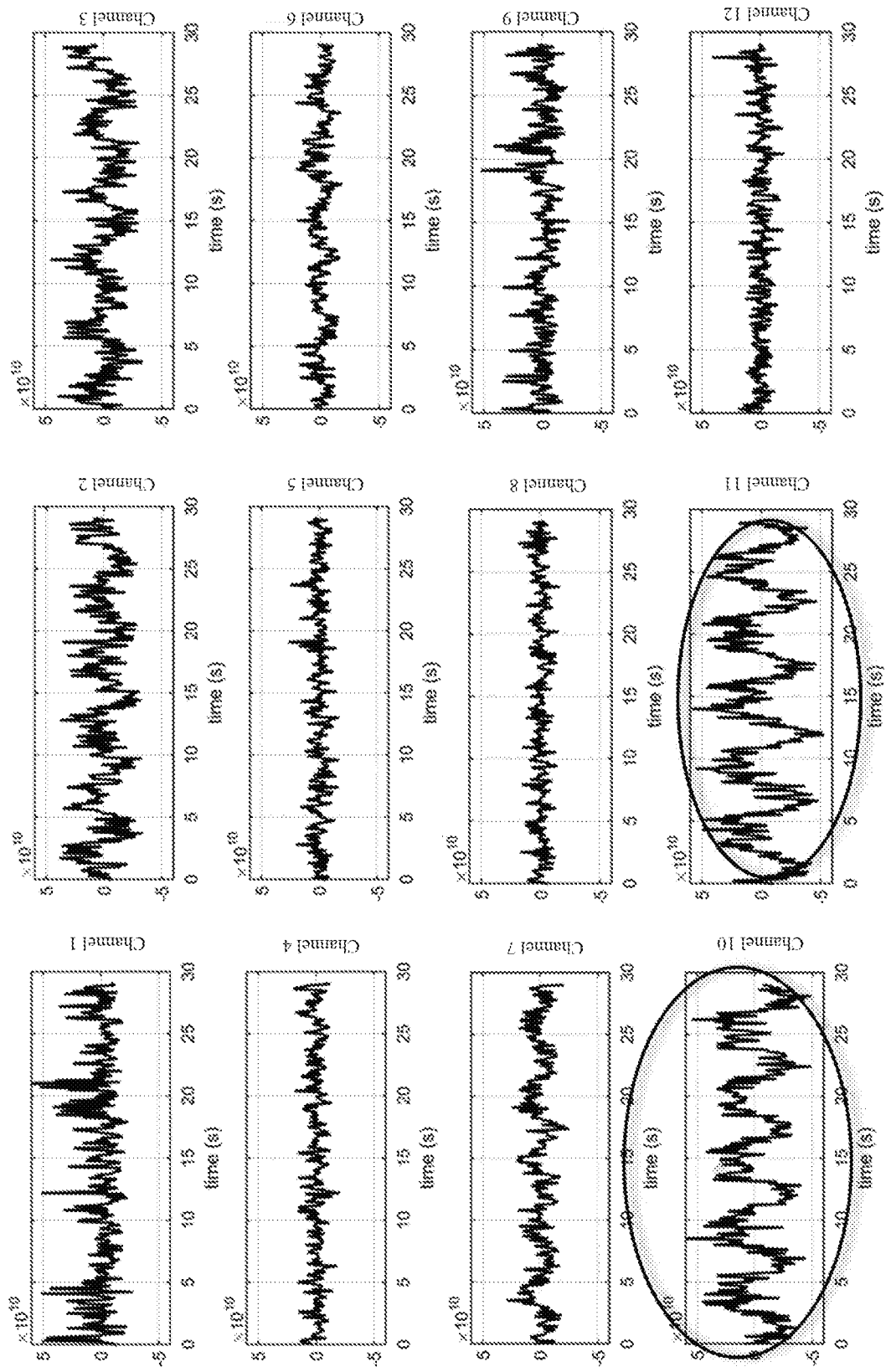
FIG. 6 to FIG. 9 illustrate data of each process stage of a respiratory motion track obtained by utilizing embodiments of the present disclosure.
Figure 7:
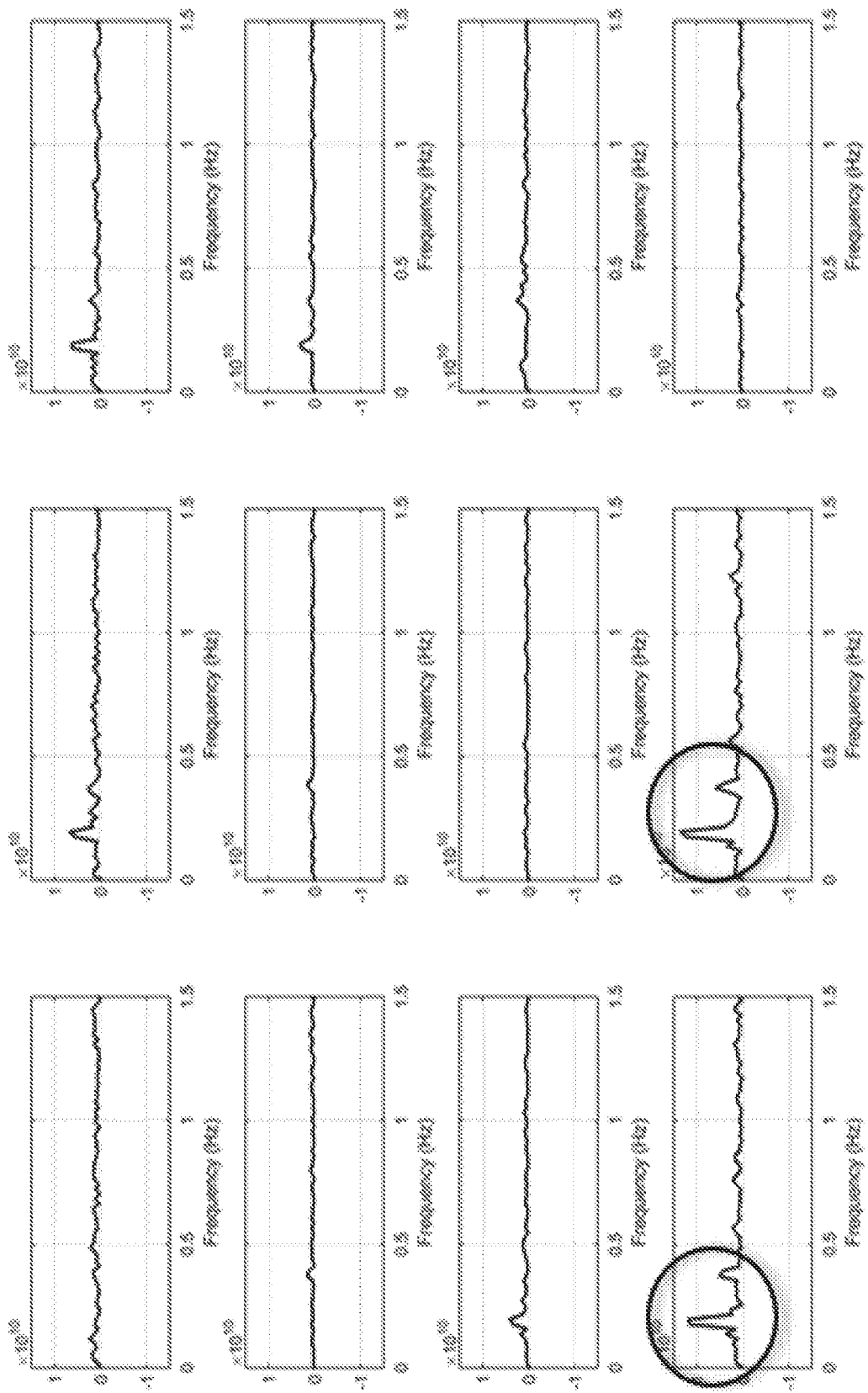
Figure 8:
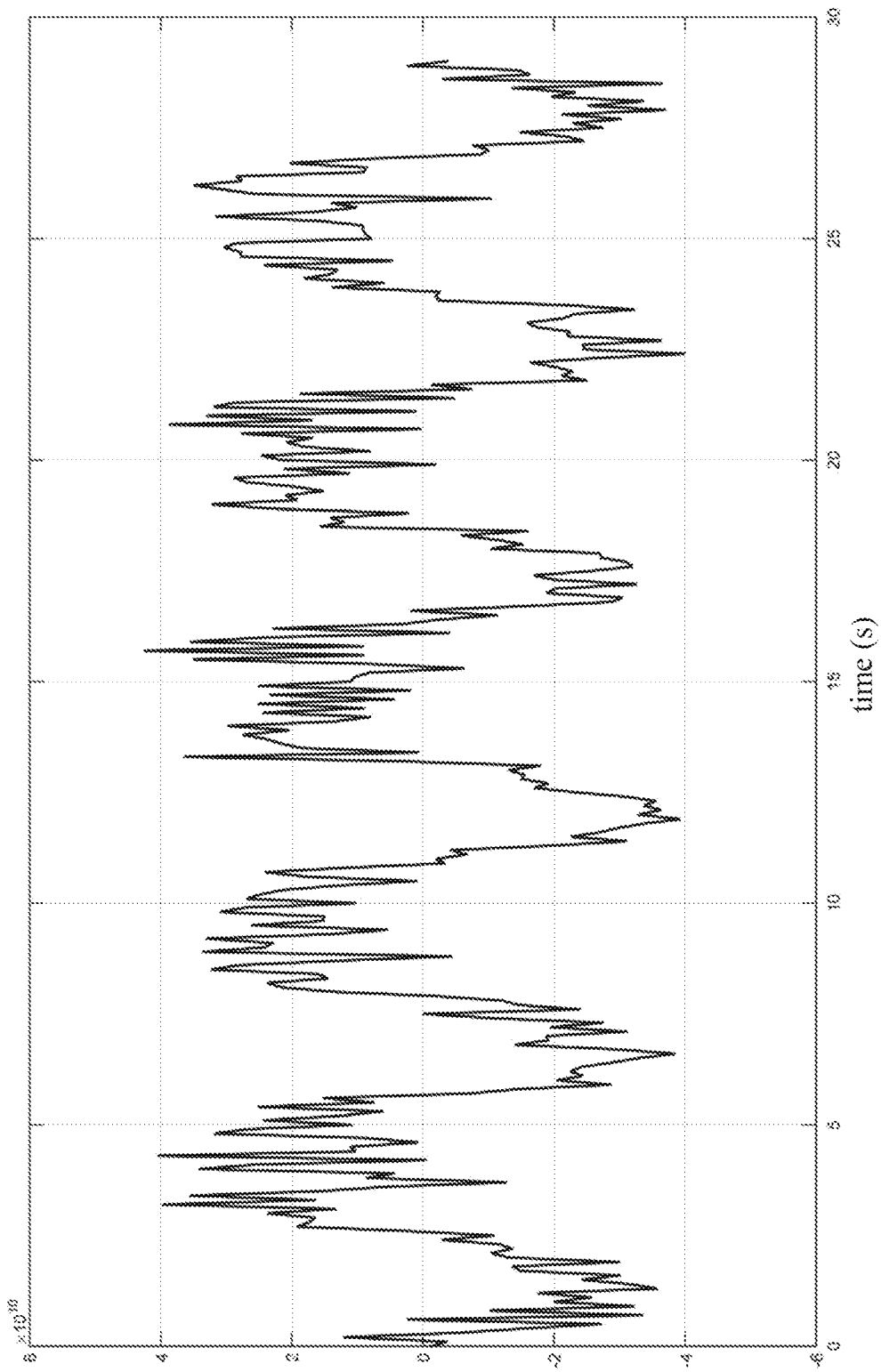
Figure 9:
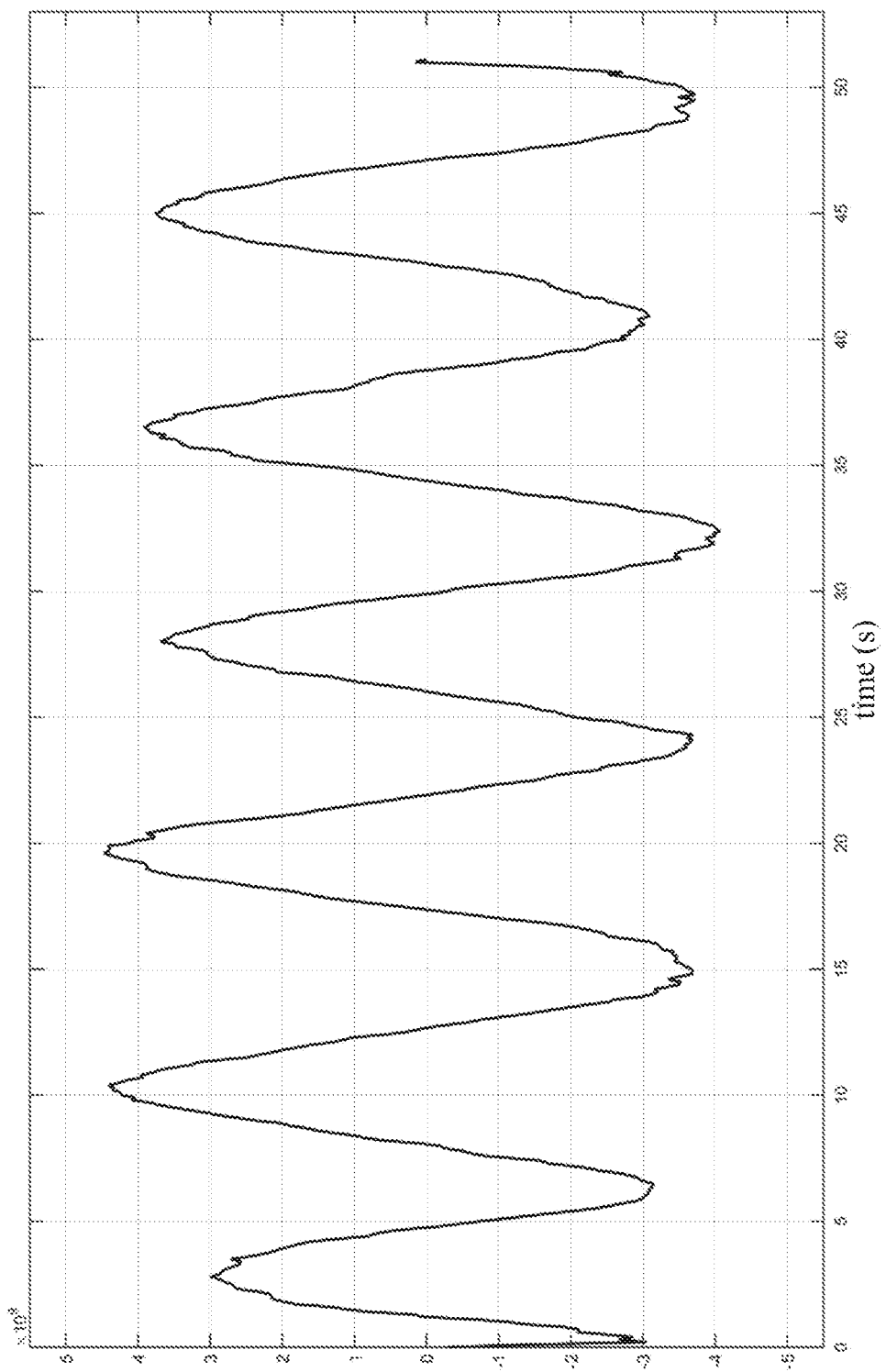
Figure 10:
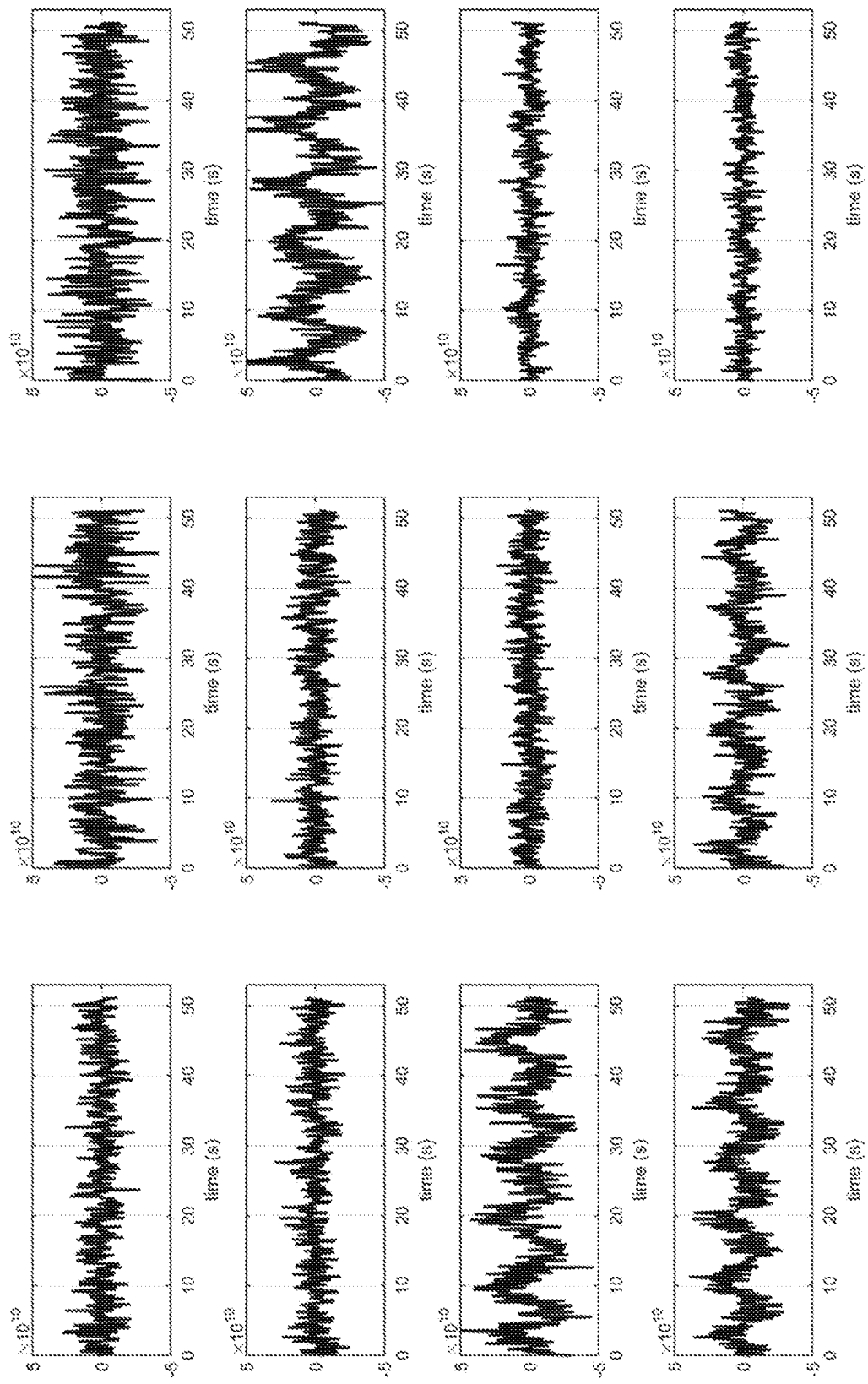
FIG. 10 to FIG. 13 illustrate data of each process stage of a respiratory motion track for a volunteer monitored with embodiments of the present disclosure.
Figure 11:
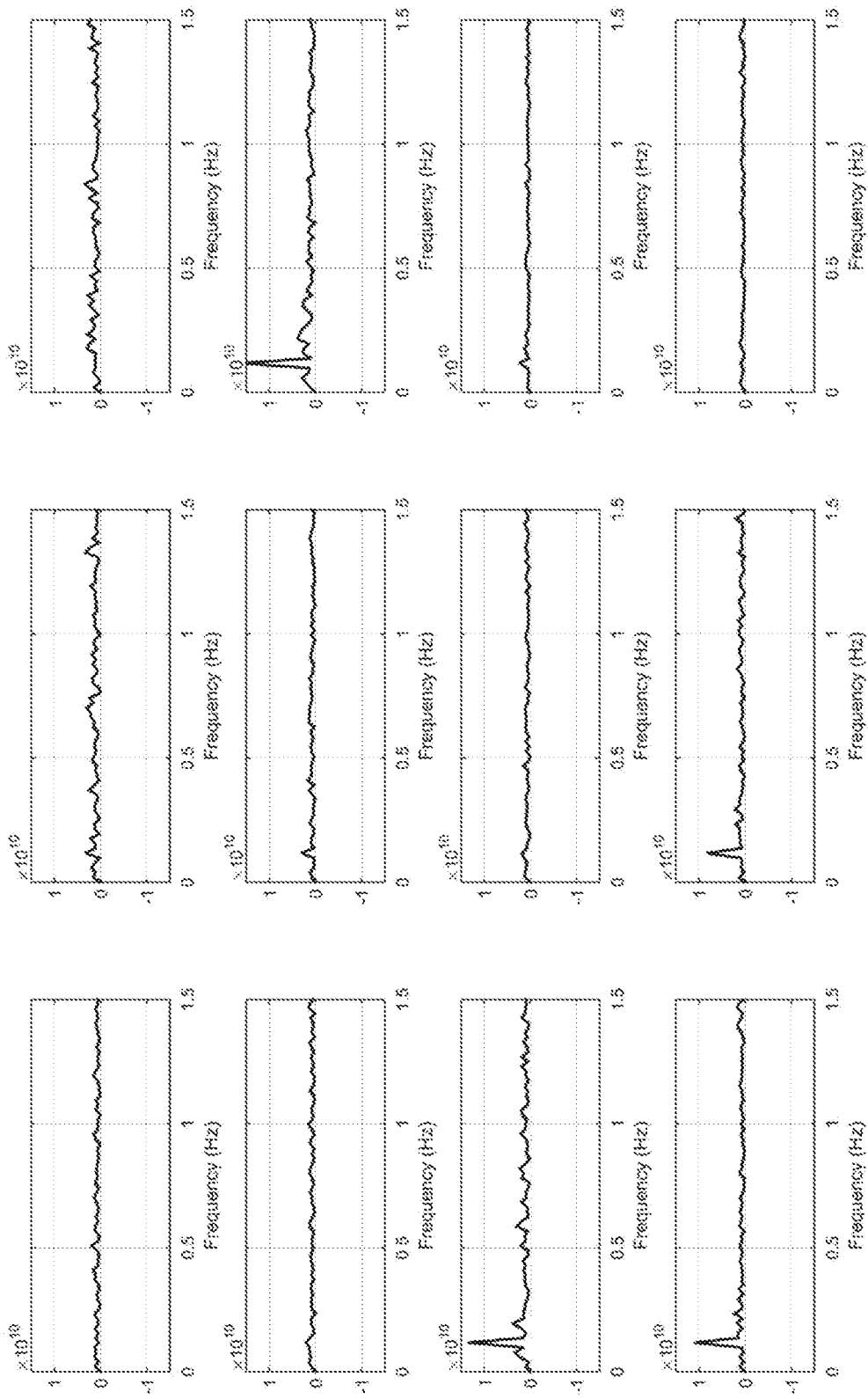
Figure 12:
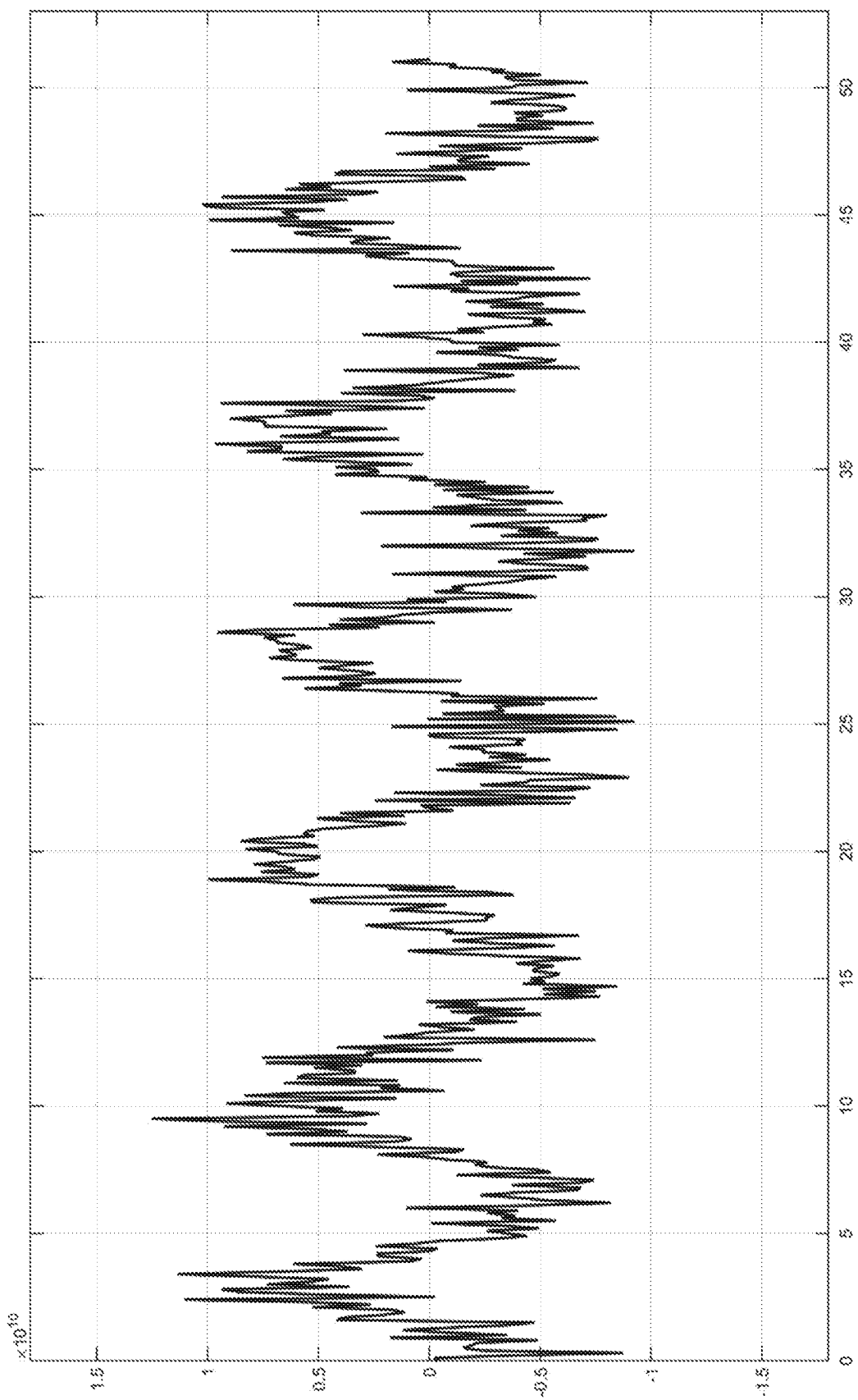

FIG. 6 to FIG. 9 respectively illustrate data of each process stage of a respiratory motion track obtained by utilizing the embodiments of the present disclosure, in which FIG. 6 is data for multiple groups of noise amplitude acquired from multiple coil channels, channel 1~channel 12, FIG. 7 is frequency domain data for the multiple groups of noise amplitude, FIG. 8 is data for combined noise amplitude by combining the noise amplitude data of the main coil channels, FIG. 9 is data for a respiratory motion track obtained by filtering the combined noise amplitude of FIG. 8. For example, as shown in FIG. 6 and FIG. 7, corresponding multiple groups of frequency domain data may be obtained by performing Fourier transform on the multiple groups of noise amplitude data. By analyzing the multiple groups of frequency domain data, it can be seen that there are large frequency fluctuations in the two groups of frequency domain data on the lower left as circled in FIG. 7. In some embodiments, large frequency fluctuations mean the amplitude of fluctuations exceed a predefined threshold. In some embodiments, large frequency fluctuations mean the first and second (or more) largest fluctuations among all fluctuations. Therefore, the corresponding noise amplitude data may be re-obtained by performing inverse Fourier transform on the two groups of frequency domain data respectively, e.g., the two groups of noise amplitude data marked by circles in FIG. 6. By matching the two groups of noise amplitude data with the noise amplitude data acquired from the respective coil channels, the main coil channels (channel 10, channel 11) associated with the respiratory motion can be determined.

Therefore, before the step S130, the following steps may further be comprised: converting the frequency domain data of noise acquired from each coil channel into corresponding noise amplitude data. For example, through the above inverse Fourier transform, the two groups of noise amplitude information marked by circles as shown in FIG. 6 are obtained.

In the step S130, by summing up squares of noise amplitudes in the two groups of noise amplitude information, the combined noise amplitude data as shown in FIG. 8 is obtained.

In the step S140, the sum of squares of noise amplitudes is filtered, and a smoother respiratory motion track as shown in FIG. 9 may be obtained. The filtering manner may be a low-pass filtering.

The embodiments of the present invention also provide a computer program, when running in an MR imaging system, causing the MR imaging system to carry out the motion monitoring method of anyone of the above embodiments. For example, the computer program comprises a plurality of instructions for carrying out the respective steps of the above motion monitoring method. The above computer program may be installed, for example, in a computer console of the MR imaging system, and may be loaded and carried out by a processor of the computer console.

The embodiments of the present invention may also provide a storage device, which is used for storing the computer program.

Two sets of experiments conducted in order to solve the technical problem of the present invention will be described in the following:

The two sets of experiments are conducted based on an MR scanning imaging product Kizuna 1.5 T, which has a surface coil array consisting of 12 surface coil channels. A phantom is placed on a scanning table. The surface coil array is fixed relative to a main magnetic field.

In the first set of experiments, the scanning table is moved back and forth periodically using a software "table rocker" and the embodiments of the present invention are carried out on the phantom as the scanned object.

In the second set of experiments, the software "table rocker" is closed and the scanning table does not move any more.

When the embodiments of the present disclosure are carried out on the phantom as the scanned subject under the condition of the first set of experiments, the experiment results of the respective stages are as shown in FIG. 6 to FIG. 9, which will not be repeated in detail. When the embodiments of the present disclosure are carried out on the phantom as the scanned subject under the condition of the second set of experiments, no periodic signal of noise can be acquired. A comparison between the two sets of experiments shows that the noise dynamic variation of the receiving coil is mainly caused by the motion of the phantom. Moreover, even if the displacement, velocity and the like of the scanning table is adjusted to maximum, the noise variation curves caused by the motion all basically appear as sinusoids. In addition, only a part of the channels in the receiving coil array make contribution to the effective noise variation.

Figure 13:
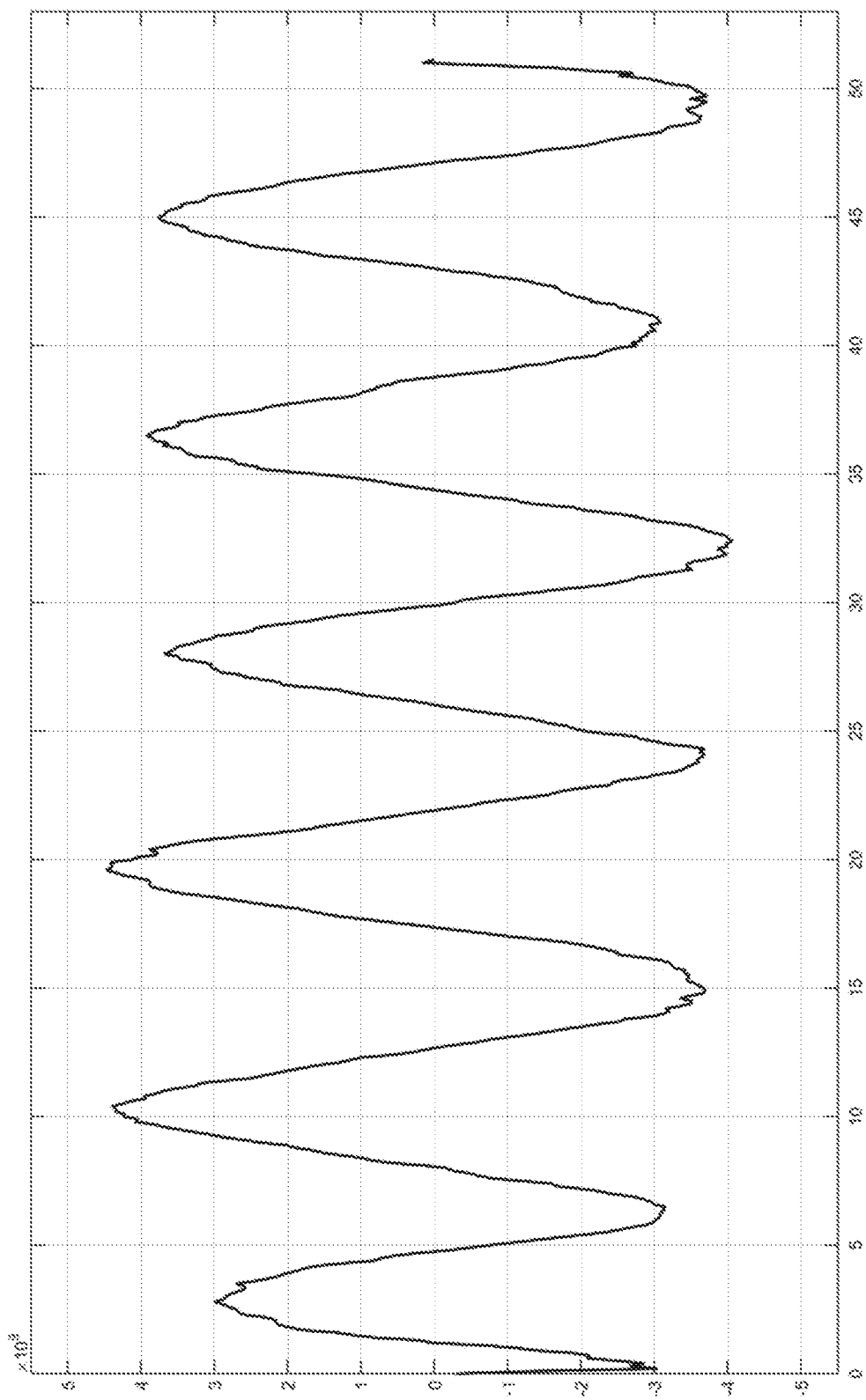
Figure 14:
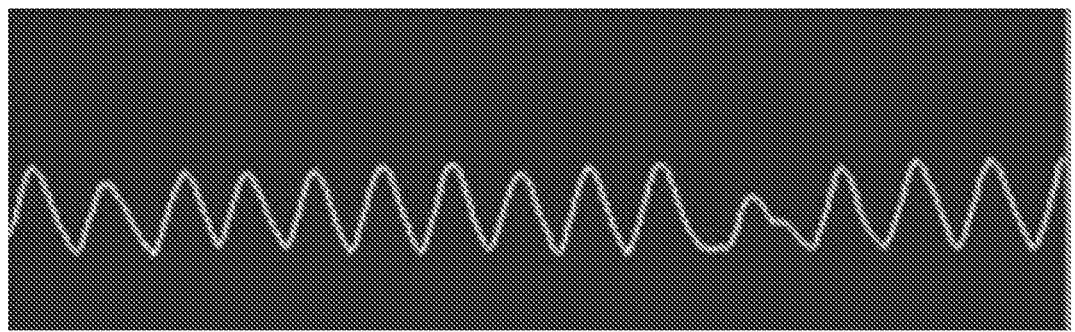
FIG. 14 is a respiratory motion track of a volunteer obtained with an external monitor.
Figure 15:
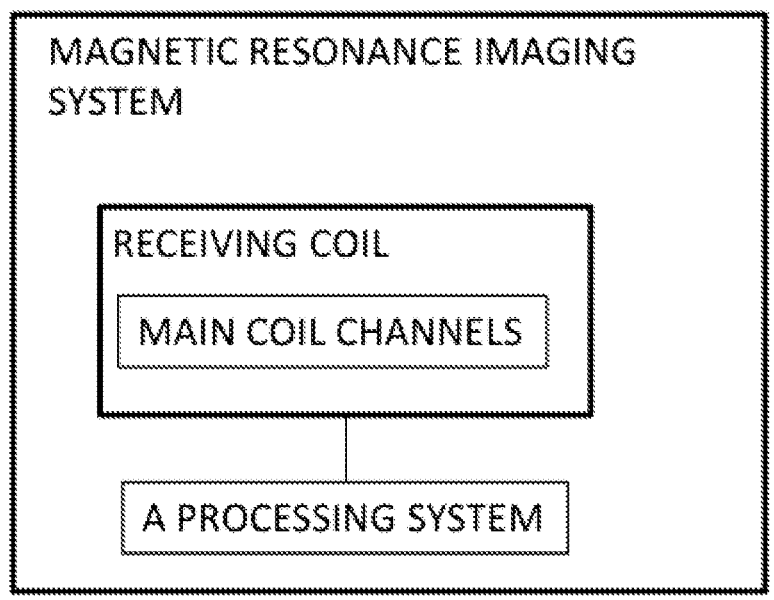
FIG. 15 is a schematic diagram of an exemplary magnetic resonance imaging system.

FIG. 10 to FIG. 13 respectively illustrate data of respective process stages of a respiratory motion track of a volunteer monitored with the embodiments of the present invention, and FIG. 14 is a respiratory motion track of a volunteer obtained with an external monitor. Specifically, the respiratory motion track obtained by monitoring with the embodiments of the present invention is as shown in FIG. 13, which matches with the motion track monitored with the external monitor as shown in FIG. 14.

The above experiments and clinical outcomes show that by the embodiments of the present disclosure, a motion track, e.g., a respiratory motion track, of a scanned subject can be monitored effectively.

By performing nesting sequences of repetition time before or after an imaging repetition time of an imaging scanning sequence, the embodiments of the present invention acquire noise of a receiving coil. Since variation of the noise is mainly caused by a motion of a scanned object, a motion curve of the scanned object can just be obtained by further processing the acquired noise without the need for extra hardware, with a lower cost and a higher accuracy, which can help to reduce motion artifacts in imaging the scanned object.

In addition, since a navigation sequence may be performed in the case that application of pulse scanning is stopped, extra latency time is avoided, thus avoiding extension of scanning time.

Some exemplary embodiments have been described above, however, it should be understood that various modifications may be made. For example, if the described techniques are carried out in different orders, and/or if the components in the described system, architecture, apparatus or circuit are combined in different ways and/or replaced or supplemented by additional components or equivalents thereof, proper results may still be achieved. Accordingly, other implementations also fall within the protection scope of the Claims.

What is claimed is:

1. A motion monitoring method during magnetic resonance (MR) imaging, comprising:
   acquiring noise of a receiving coil having one or more coil channels before or after each imaging repetition time of an imaging scanning sequence;
   determining main coil channels of the receiving coil among the one or more coil channels associated with a motion of a scanned object from the receiving coil;
   combining noise of the main coil channels; and
   filtering the combined noise to obtain a motion track of the scanned object.

2. The method of claim 1, wherein the acquiring noise of the receiving coil comprises:
   performing a navigation sequence before or after each imaging repetition time of the imaging scanning sequence, wherein during the performing of the navigation sequence, application of RF excitation pulses is stopped and the noise of the receiving coil is acquired.

3. The method of claim 1, wherein the navigation sequence applied before each imaging repetition time is spaced from an adjacent imaging repetition time and includes a plurality of navigation repetition times, with adjacent navigation repetition time spaced from each other.

4. The method of claim 3, further comprising when the acquired noise of the receiving coil is within a first preset range, triggering one imaging repetition time of the imaging scanning sequence to acquire image data.

5. The method of claim 2, wherein the navigation sequence applied after each imaging repetition time comprises a navigation repetition time that follows its preceding imaging repetition time.

6. The method of claim 5, further comprising:
   when an amplitude of the noise of the receiving coil acquired within any navigation repetition time is outside a second preset range, determining image data acquired within the imaging repetition time before the navigation repetition time as invalid image data; and
   when the amplitude of the noise of the receiving coil acquired within any navigation repetition time is within the second preset range, determining the image data acquired within the imaging repetition time before the navigation repetition time as valid image data.

7. The method of claim 1, wherein the determining main coil channels comprises:

analyzing frequency domain data of noise acquired from each coil channel; and determining coil channels corresponding to the frequency domain data with a large frequency fluctuation as the main coil channels.

8. The method of claim 7, further comprising, converting the frequency domain data of noise acquired from each coil channel into corresponding noise amplitude data.

9. The method of claim 1, wherein combining noise of the main coil channels comprises summing up squares of amplitudes of noises of respective main coil channels.

10. A magnetic resonance imaging (MRI) system comprising:

a receiving coil having one or more coil channels; and
a processing system configured to:
acquire noise of the receiving coil before or after each imaging repetition time of an imaging scanning sequence;
determine main coil channels of the receiving coil among the one or more coil channels associated with a motion of a scanned object from the receiving coil;
combine noise of the main coil channels; and
filter the combined noise to obtain a motion track of the scanned object.

11. The MRI system of claim 10, wherein the processing system is further configured to perform a navigation sequence before or after each imaging repetition time of the imaging scanning sequence, wherein during the performing of the navigation sequence, application of RF excitation pulses is stopped and the noise of the receiving coil is acquired.

12. The MRI system of claim 10, wherein the navigation sequence applied before each imaging repetition time is spaced from an adjacent imaging repetition time and includes a plurality of navigation repetition times, with adjacent navigation repetition time spaced from each other.

13. The MRI system of claim 12, wherein the processing system is further configured to trigger one imaging repetition time of the imaging scanning sequence to acquire image data when the acquired noise of the receiving coil is within a first preset range.

14. The MRI system of claim 11, wherein the navigation sequence applied after each imaging repetition time comprises a navigation repetition time that follows its preceding imaging repetition time.

15. The MRI system of claim 14, the processing system is further configured to:

determine image data acquired within the imaging repetition time before the navigation repetition time as invalid image data when an amplitude of the noise of the receiving coil acquired within any navigation repetition time is outside a second preset range; and determine the image data acquired within the imaging repetition time before the navigation repetition time as valid image data when the amplitude of the noise of the receiving coil acquired within any navigation repetition time is within the second preset range.

16. The MRI system of claim 10, wherein the determining main coil channels comprises:

analyzing frequency domain data of noise acquired from each coil channel; and determining coil channels corresponding to the frequency domain data with a large frequency fluctuation as the main coil channels.

17. The MRI system of claim 16, wherein the processing system is further configured to convert the frequency domain data of noise acquired from each coil channel into corresponding noise amplitude data.

18. The MRI system of claim 10, wherein combining noise of the main coil channels comprises summing up squares of amplitudes of noises of respective main coil channels.

19. A non-transitory computer readable media storing instructions, when executed by a processing system, causing the processing system to:

acquire noise of a receiving coil of an MRI system before or after each imaging repetition time of an imaging scanning sequence, the receiving coil having one or more coil channels;

determine main coil channels of the receiving coil among the one or more coil channels associated with a motion of a scanned object from the receiving coil;

combine noise of the main coil channels; and filter the combined noise to obtain a motion track of the scanned object.

20. The media of claim 19, wherein combining noise of the main coil channels comprises summing up squares of amplitudes of noises of respective main coil channels.

* * * * *